US012590992B2

(12) United States Patent
Chen et al.

(10) Patent No.: US 12,590,992 B2
(45) Date of Patent: Mar. 31, 2026

(54) PROBE HEAD STRUCTURES FOR CIRCUIT PROBE TEST SYSTEMS AND METHODS OF FORMING THE SAME

(71) Applicant: Taiwan Semiconductor Manufacturing Company Limited, Hsinchu (TW)

(72) Inventors: Kuan Chun Chen, Hsinchu City (TW); Shu An Shang, Kaohsiung City (TW); Kai-Yi Tang, New Taipei City (TW); Guang-Sing Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 107 days.

(21) Appl. No.: 18/509,059

(22) Filed: Nov. 14, 2023

(65) Prior Publication Data

US 2025/0093385 A1      Mar. 20, 2025

Related U.S. Application Data

(60) Provisional application No. 63/582,867, filed on Sep. 15, 2023.

(51) Int. Cl.
*G01R 1/073* (2006.01)
*G01R 3/00* (2006.01)
(52) U.S. Cl.
CPC ........... *G01R 1/07342* (2013.01); *G01R 3/00* (2013.01)
(58) Field of Classification Search
None
See application file for complete search history.

(56) References Cited

U.S. PATENT DOCUMENTS 4,667,219 A * 5/1987 Lee ................... H01L 23/49827
257/713
7,279,911 B2 * 10/2007 Tunaboylu ......... G01R 1/07378
324/762.01

(Continued)

FOREIGN PATENT DOCUMENTS

TW          I597501 B      9/2017
TW          I810885 B      8/2023

OTHER PUBLICATIONS

TW Patent and Trademark Office; TW Application No. 113100553; Office Action mailed Sep. 24, 2024; 10 pages.

*Primary Examiner* — Richard Isla
(74) *Attorney, Agent, or Firm* — The Marbury Law Group, PLLC

(57) ABSTRACT

A probe card for a circuit probe test system and methods of fabrication thereof. The probe card includes a substrate portion, a guide plate having a plurality of openings, and a plurality of probe pins extending through the openings, including at least one first probe pin configured to carry power between the substrate portion and a device-under-test (DUT), at least one second probe pin configured to electrically couple the DUT to ground, and at least two third probe pins configured to carry loopback test signals between contact regions on the DUT. A low dielectric constant (low-k) material may be located between the third probe pins and the guide plate. The low-k material may prevent direct contact between the third probe pins and the relatively higher dielectric-constant material of the guide plate, which may improve the signal integrity (SI) of the loopback test signals.

20 Claims, 8 Drawing Sheets

(56)     References Cited

U.S. PATENT DOCUMENTS

| | | | |
|---|---|---|---|
| 8,911,266 B2 | 12/2014 | Kawate et al. | |
| 10,209,275 B2 * | 2/2019 | Chui | G01R 1/07342 |
| 2017/0059611 A1 | 3/2017 | Lesnikoski | |
| 2018/0024167 A1 * | 1/2018 | Maggioni | G01R 1/07342 |
| | | | 324/750.24 |
| 2019/0377005 A1 * | 12/2019 | Crippa | G01R 1/07371 |
| 2020/0003802 A1 * | 1/2020 | Lee | G01R 1/0466 |
| 2025/0216419 A1 * | 7/2025 | Lu | G01R 1/07371 |

* cited by examiner

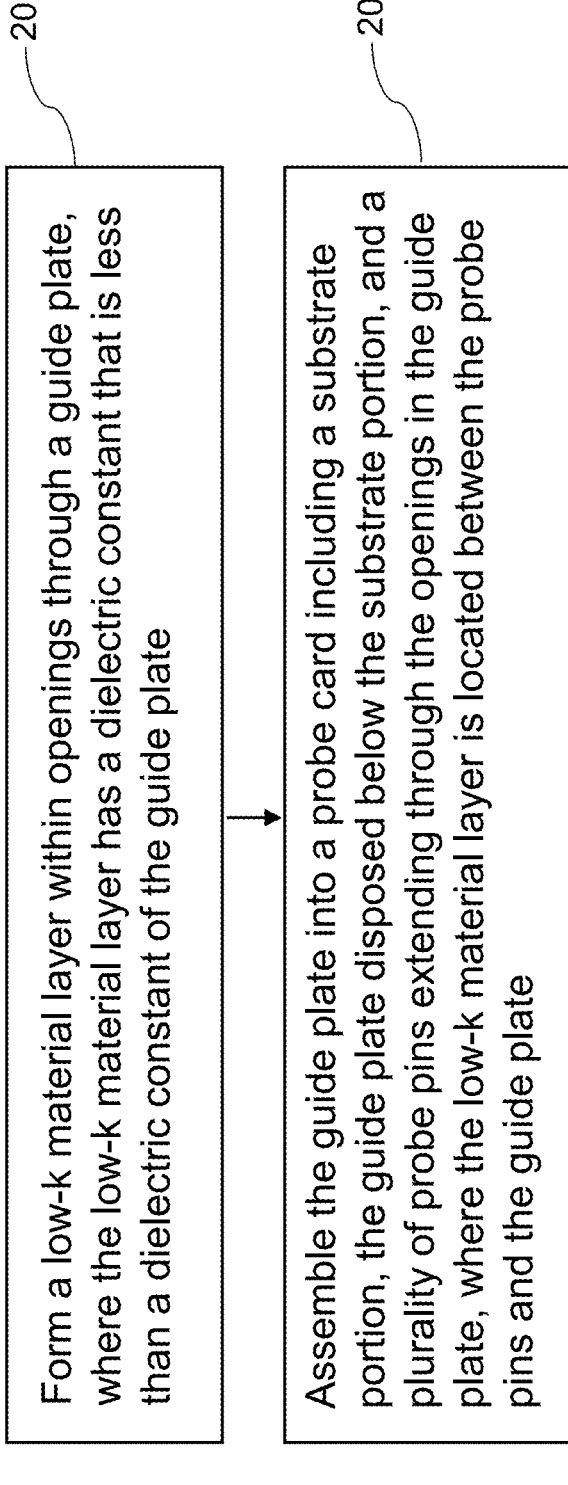

201

Form a low-k material layer within openings through a guide plate, where the low-k material layer has a dielectric constant that is less than a dielectric constant of the guide plate

203

Assemble the guide plate into a probe card including a substrate portion, the guide plate disposed below the substrate portion, and a plurality of probe pins extending through the openings in the guide plate, where the low-k material layer is located between the probe pins and the guide plate

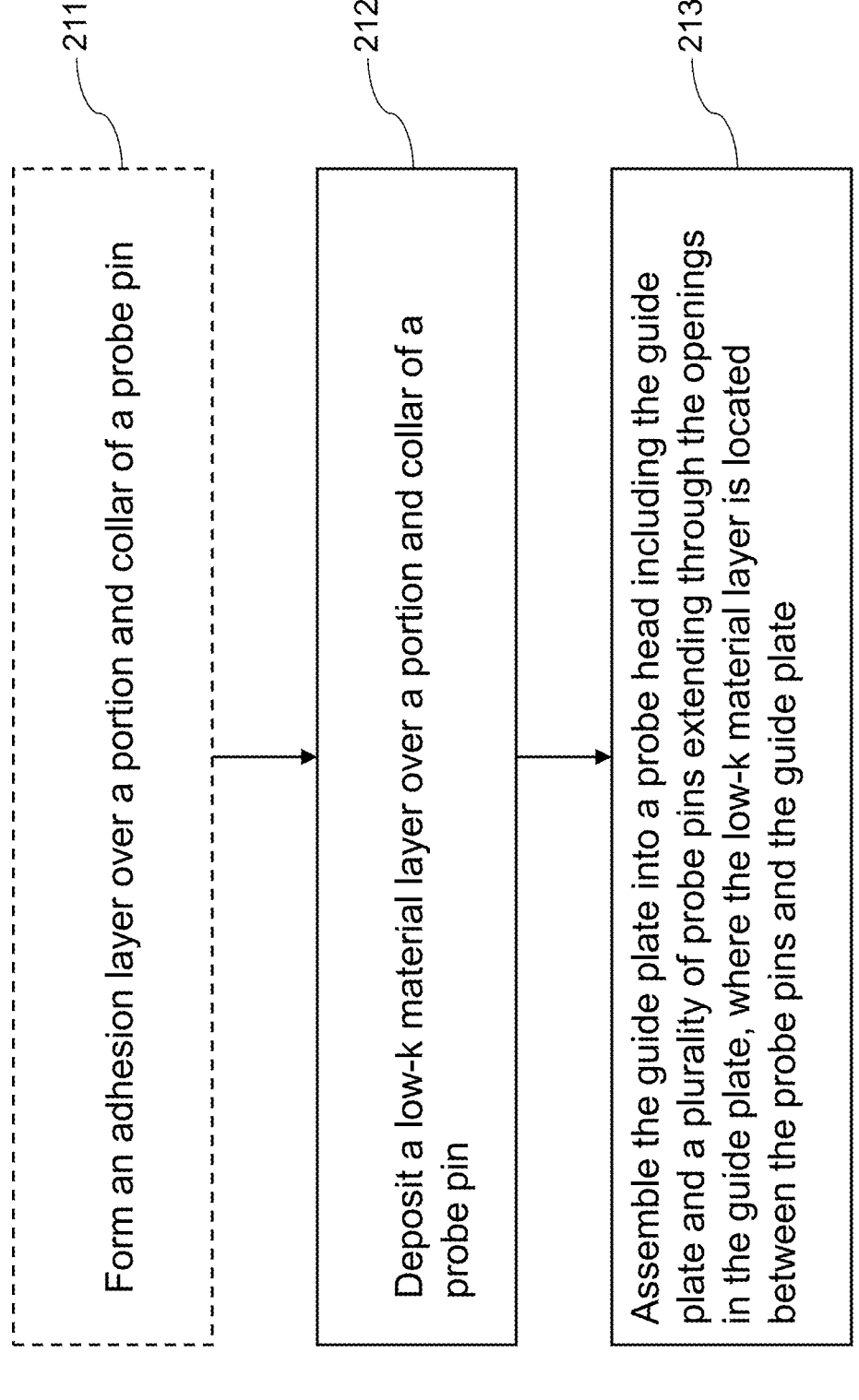

211

Form an adhesion layer over a portion and collar of a probe pin

212

Deposit a low-k material layer over a portion and collar of a probe pin

213

Assemble the guide plate into a probe head including the guide plate and a plurality of probe pins extending through the openings in the guide plate, where the low-k material layer is located between the probe pins and the guide plate

PROBE HEAD STRUCTURES FOR CIRCUIT PROBE TEST SYSTEMS AND METHODS OF FORMING THE SAME

RELATED APPLICATION

The present application claims the benefit of priority to U.S. Provisional Application No. 63/582,867, entitled "Novel Probe Structure in Probe Card," filed on Sep. 15, 2023, the entire contents of which are incorporated by reference herein for all purposes.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow chart showing a method of fabricating a probe head for a circuit probe test system according to various embodiments of the present disclosure.

FIG. 7 is a flow chart showing a method of fabricating a probe pin for a circuit probe test system according to various embodiments of the present disclosure.

DETAILED DESCRIPTION

Figure 1:
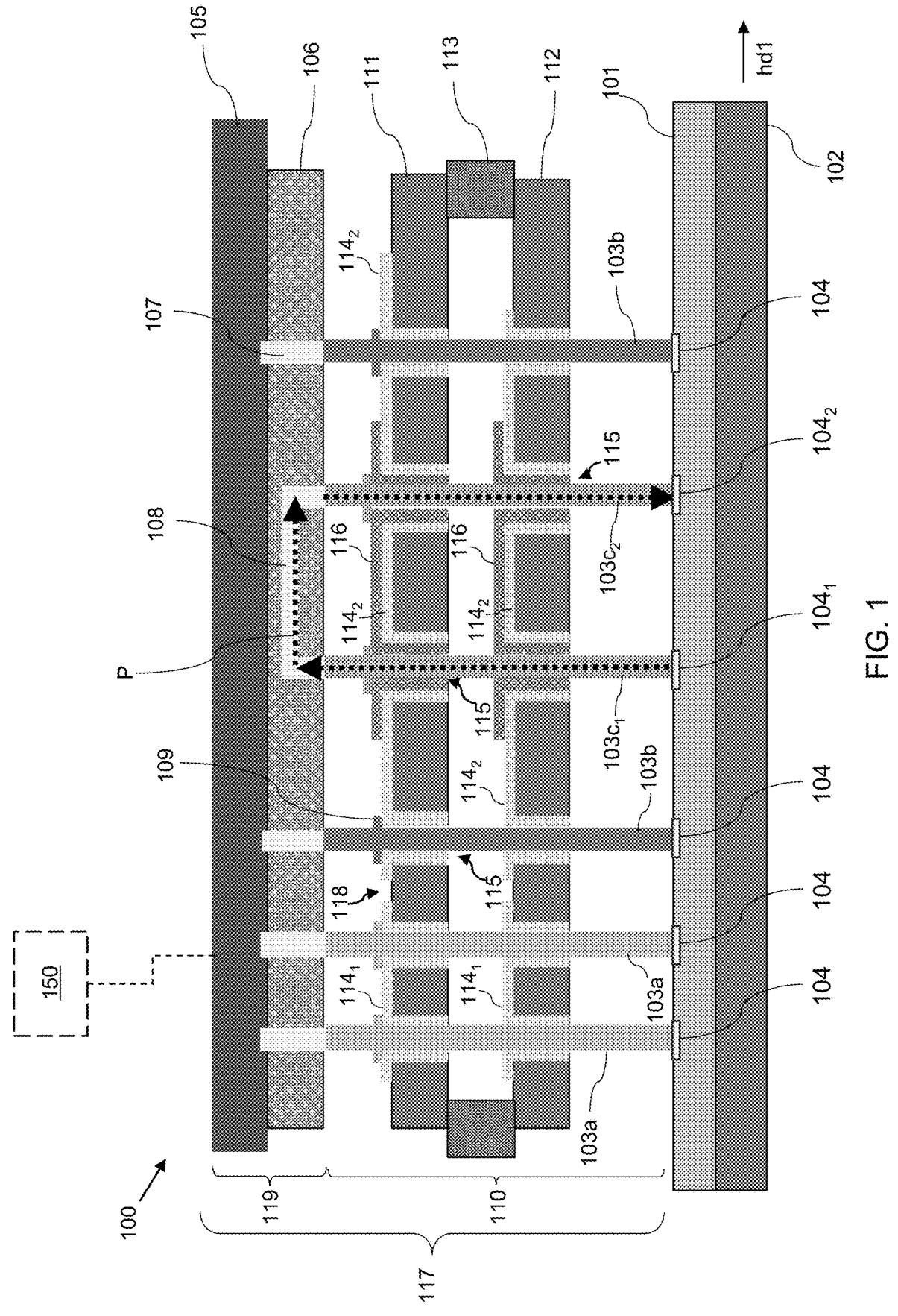
FIG. 1 is a vertical cross-section view of a portion of a circuit probe test system that may be used to perform circuit probe testing, such as loopback testing, of a device under test (DUT) according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to circuit probe test systems for performing circuit probe testing of electronic devices, such as semiconductor integrated circuit devices, and methods of fabrication thereof.

Circuit probe testing is an important tool during fabrication of electronic devices, such as semiconductor integrated circuit (IC) devices. A circuit probe test system, which may also be referred to as a wafer prober, is a specialized system used to test and validate the designed functionality of electronic circuits. Circuit probe testing may enable the identification of faulty or defective devices (e.g., semiconductor IC devices) at a relatively early stage of the overall production process (e.g., prior to wafer dicing or packaging), which may result in enhanced cost savings.

A circuit probe test system typically includes a probe card having a probe head including a plurality of probe pins that may be brought into contact with contact pads on the device being tested. The probe card may also include a substrate portion including a printed circuit board (PCB) that may function as an interface between the circuit probe test system and the device under test (DUT). The circuit probe test system transmits electrical test signals to the DUT through the substrate portion and the probe pins of the probe head and detects electrical response signals from the DUT that are received through the probe pins and the substrate portion. Each of the probe pins includes an elongate structure having a length of a millimeter or more, such as between 4 mm and 7 mm. The probe head typically also includes a probe head fixture including one or more ceramic guide plates having openings through which the probe pins extend. The probe head fixture is intended to maintain proper alignment of the probe pins during testing while still allowing the probe pins a degree of elastic deformability.

One type of testing that may be performed using a circuit probe test system is a "loopback" test. A loopback test may be used to test communication functionality of a DUT, such as the functionality of the device transmitter (Tx) and/or receiver (Rx) components for different communications protocols (e.g., USB, PCIe, etc.). The probe head may be used to route signals between different contact pads/bumps on the DUT to test the communication functionality of the device. An important parameter for performing circuit probe testing is the signal integrity (SI) of the electronic signals transmitted between the circuit probe test system and the DUT.

Circuit probe testing systems as described above may often be characterized by relatively poor SI performance, including during circuit probe loopback testing. This may be due, in part, to the design of the probe head in related circuit probe testing systems. In related circuit probe testing systems, the probe pins may contact the ceramic material of the guide plates used to maintain proper alignment of the probe pins during testing. However, during a high-frequency loopback test, direct contact between the probe pins and the relatively high dielectric-constant material of the guide plates may significantly degrade the signals transmitted through the probe pins. In addition, during a loopback test, the loopback signals typically traverse a relatively long signal path that includes the length of the probe pin that carries the signal from the DUT to the substrate portion of the probe card, the length of a conductive path within the substrate portion of probe card, and the length of probe pin that carries the signal from the substrate portion back to the DUT. This long loopback signal path may further degrade the signal integrity (SI) of the loopback signals.

Accordingly, there is a need for improvements in circuit probe test systems to provide improved signal integrity (SI) for loopback testing of a device-under-test (DUT). Various embodiments of the present disclosure include a probe card for a circuit probe test system and methods of fabrication thereof. The probe card may include a substrate portion, and a probe head including a guide plate located below the substrate portion and having a plurality of openings through the guide plate, and a plurality of probe pins extending through the openings through the guide plate. The plurality of probe pins may include at least one first probe pin configured to carry power between the substrate portion and a device-under-test (DUT), at least one second probe pin configured to electrically couple the DUT to ground, and at least two third probe pins configured to carry loopback test signals between contact regions on the DUT. A low dielectric constant material (i.e., a low-k material) layer may be located between the third probe pins and the guide plate. The low-k material layer may prevent direct contact between the third probe pins and the guide plate, which may be composed of a ceramic or other high-k material. The inclusion of the low-k material layer may inhibit degradation of the loopback test signals resulting from contact between the third probe pins and the high-k material of the guide plate, thereby improving the signal integrity (SI) of the loopback test signals.

In some embodiments, the low-k material layer may be provided as a coating on the guide plate, such as within the openings through which the third probe pins extend as well as other portions of the guide plate where the third probe pins may contact the guide plate.

Alternatively, or in addition, the low-k material layer may be coated on portions of the third probe pins that are located adjacent to the guide plate in the assembled probe head.

In some embodiments, a conductive trace may be provided on a guide plate of the probe head. The conductive trace may be electrically coupled to, and may extend between, a pair of third probe pins and may be utilized to shorten the loopback signal path. In other words, rather than routing the loopback signal path through the substrate portion of the probe card as in related circuit probe testing systems, the loopback signal path may be routed through a conductive trace located over a guide plate of the probe head to provide a reduced loopback signal path length. The reduced length of the loopback signal path may provide further improvements to the SI of the loopback test signals. A low-k material layer may be located between the conductive trace and the surface of the guide plate over which the conductive trace is located.

In some embodiments, an adhesion layer may be provided over portions of the guide plate and/or the third probe pins, and the low-k material layer may be formed over the adhesion layer. The adhesion layer may include a metal or metal alloy material. The adhesion layer may promote adhesion of the low-k material layer to the guide plate and/or the third probe pins, and may also provide enhanced shielding between the third probe pins and/or a conductive trace and the high-k material of the guide plate.

In some embodiments, a conductive layer may be formed surrounding the openings in the guide plate through which the first probe pins and/or the second probe pins extend. The conductive layer may electrically couple multiple second probe pins extending through the guide plate, thereby electrically shorting multiple ground connections to the DUT. Alternatively, or in addition, the conductive layer may electrically couple multiple first probe pins extending through the guide plate, thereby electrically shorting multiple power connections to the DUT. This may help to balance current spikes and may enable more effective thermal management in the circuit probe test system. In various embodiments, the conductive layer may be composed of the same material(s) as the adhesion layer, and it may be formed (e.g., deposited) simultaneously with the adhesion layer.

FIG. 1 is a vertical cross-section view of a portion of a circuit probe test system 100 that may be used to perform circuit probe testing, such as loopback testing, of a device under test (DUT) 101 according to various embodiments of the present disclosure. In some embodiments, the DUT 101 may include a semiconductor substrate, such as a silicon wafer, having circuit components formed on and/or within the semiconductor substrate. Other suitable structures for the DUT 101, such as semiconductor integrated circuit (IC) dies and/or semiconductor IC package structures, are within the contemplated scope of disclosure. The DUT 101 may be located on a lower support member 102, such as a wafer chuck.

Referring again to FIG. 1, the circuit probe test system 100 includes a probe card 117 including a substrate portion 119 and a probe head 110. The circuit probe test system 100 may further include a system controller 150 that may be coupled to an actuator system (not shown) configured to move the probe card 117 along one or more horizontal directions with respect to the lower support member 102 in order to align the probe head 110 over selected regions(s) of the DUT 101. Alternatively, or in addition, the lower support member 102 may be moved to align the probe head 110 over selected region(s) of the DUT 101. In some embodiments, the system controller 150 of the circuit probe test system 100 may be operatively coupled to an optical detection system that may be used to align the probe head 110 over particular region(s) of the DUT 101 using optical pattern recognition. In some embodiments, the probe head 110 of the circuit probe test system 100 may form the distal end of a robotic arm.

The probe head 110 may include a plurality of probe pins 103a, 103b, 103c which may also be referred to as probe "needles." In the embodiment shown in FIG. 1, the probe head 110 also includes a pair of guide plates, including an upper guide plate 111 and a lower guide plate 112. A spacer 113 may be located between the upper guide plate 111 and the lower guide plate 112. The upper guide plate 111 and the lower guide plate 112 may be formed of suitable structural material(s), such as a ceramic material, an engineered plastic material, or the like. Other suitable materials for the upper guide plate 111 and the lower guide plate 112 are within the contemplated scope of disclosure. The upper guide plate 111 and the lower guide plate 112 may each include a plurality of openings 115 extending through the respective guide plates 111 and 112. The probe pins 103a, 103b, 103c may extend through the openings 115 in the upper guide plate 111 and the lower guide plate 112. The probe pins 103a, 103b, 103c may include a collar 109 or a similar feature that may project radially outward from the body of probe pins 103a, 103b, 103c to prevent the probe pins 103a, 103b, 103c from passing completely through the openings 115 in the upper guide plate 111.

In some embodiments, the substrate portion 119 of the probe card 117 may include a printed circuit board (PCB) 105 that may include circuit elements that may be utilized for conducting circuit probe testing of the DUT 101. In the embodiment of FIG. 1, an interconnect layer 106 may be located over the lower surface of the PCB 105. The interconnect layer 106 may include a dielectric matrix material having conductive interconnect structures 107 extending therethrough. In some embodiments, the interconnect layer 106 may include a multilayer organic (MLO) structure including multiple layers of dielectric polymer material with metal interconnect structures embedded within. In embodiments in which the probe pins 103a, 103b, 103c are inserted through the upper guide plate 111 and the lower guide plate 112, at least some of the probe pins 103a, 103b and 103c may contact interconnect structures 107 on the lower surface of the interconnect layer 106, which may electrically connect the probe pins 103a, 103b, 103c to the PCB 105. In the embodiment shown in FIG. 1, the probe pins 103a, 103b, 103c may "float" with respect to the substrate portion 119, meaning that the probe pins 103a, 103b, 103c are not bonded or otherwise affixed to the substrate portion 119. In other embodiments, the probe pins 103a, 103b, 103c may be bonded to electrical contacts on the interconnect layer 106, or in embodiments in which the interconnect layer 106 is omitted, directly to the PCB 105, such as via a solder connection.

During a circuit probe test, such as a loopback test, the system controller 150 may move the probe head 110 in a vertically downward direction with respect to DUT 101 to bring the lower portions of the probe pins 103a, 103b, 103c into contact with contact regions (e.g., contact pads, metal bumps, etc.) formed on the DUT 101. Upper portions of the probe pins 103a, 103b, 103c may contact interconnect structures 107 on the lower surface of the substrate portion 119. The system controller 150 may control the probe card 117 to transmit electronic test signals through a first set of one or more probe pins 103a, 103b, 103c to the DUT 101 and to receive response signals back from the DUT 101 through a second set of one or more probe pins 103a, 103b, 103c. In some embodiments, the transmitted test signals and response signals back create a loopback. The detected response signals from the DUT 101 may be analyzed and used to determine whether the DUT 101 includes any functional defects. Based on circuit probe testing, multiple DUTs 101 may be sorted such that defective DUTs 101, or portions thereof, are not used in subsequent fabrication, distribution and/or commercialization processes.

Referring again to FIG. 1, the probe pins 103a, 103b, $103c_1$ and $103c_2$ may be composed of an electrically conductive material, such as a copper-palladium alloy. Other suitable electrically conductive materials are within the contemplated scope of disclosure. During a circuit probe test, such as a loopback test, each of the probe pins 103a, 103b, $103c_1$ and $103c_2$ may provide a continuous conductive pathway along their lengths between the substrate portion 119 of the probe card 117 and contact regions 104 (e.g., contact pads, metal bumps, etc.) on the DUT 101. In the embodiment of FIG. 1, each of the probe pins 103a, 103b, 103c may have the same length dimension. In some embodiments, the length dimension of the probe pins 103a, 103b, $103c_1$ and $103c_2$ may be between about 4 mm and about 7 mm, although greater and lesser length dimensions may also be utilized.

The plurality of probe pins may include at least one first probe pin 103a that may be used to carry power between the substrate portion 119 of the probe card 117 and a device-under-test (DUT) 101. The at least one first probe pin 103a may also be referred to as a "power probe pin" 103a. The plurality of probe pins may also include at least one second probe pin 103b that may be used to connect the device-under-test (DUT) 101 to a ground voltage. The at least one second probe pin 103b may also be referred to as a "ground probe pin" 103b.

The plurality of probe pins may also include at least two third probe pins 103c. The third probe pins 103c1, 103c2 may be used to transmit electronic signals between respective contact regions 104 formed on the DUT 101 via a loopback signal path, P, during a loopback test of the DUT 101. The third probe pins 103c1, 103c2 (collectively referred to as third probe pin(s) 103c) may also be referred to as "loopback probe pins" 103c. As shown in FIG. 1, the loopback signal path, P, may extend from a first contact region 1041 on the DUT 101 through a third probe pin 103c1 along a conductive trace 108 located on and/or in the substrate portion 119 of the probe card 117 to another third probe pin 103c2, and through the other third loopback probe pin 103c2 to a second contact region 1042 on the DUT 101.

In the embodiment shown in FIG. 1, the conductive trace 108 may be formed by interconnect structures in the interconnect layer 106 of the substrate portion 119 of the probe card 117. However, in other embodiments, the conductive trace 108 may located in a different portion of the probe head 110, such as on and/or within the PCB 105, or on and/or within the upper guide plate 111 and/or the lower guide plate 112, as described in further detail below.

In addition to the power probe pin(s) 103a, ground probe pin(s) 103b and loopback probe pins 103c described above, the probe head 110 may also include additional probe pins that may be configured to perform other functions, such as one or more probe pins for carrying input-output (I/O) signals between the substrate portion 119 of the probe card 117 and the DUT 101.

Referring again to FIG. 1, an adhesion layer 114 may be formed over portions of the upper guide plate 111 and the lower guide plate 112. The adhesion layer 114 (including adhesion layer $114_1$ and adhesion layer $114_2$) may include a metallic material, such as copper, chromium, titanium, aluminum, nickel, tungsten, platinum, gold, etc., including alloys and combinations thereof. In some embodiments, the adhesion layer 114 may be formed within openings 115 through the upper guide plate 111 and the lower guide plate 112, and may extend along the side surfaces of the openings 115. In some embodiments, the adhesion layer 114 may be formed within all the openings 115 through the upper guide plate 111 and the lower guide plate 112. Alternatively, the adhesion layer 114 may only be formed within a portion of the openings 115 through the upper guide plate 111 and the lower guide plate 112. For example, the adhesion layer 114 may only be formed within the openings 115 through which the third probe pins 103c extend in the assembled probe head 110. In other embodiments, as shown in FIG. 1, the adhesion layer 114 may be formed within each of the openings 115 through which the first probe pins 103a, the second probe pins 103b, and the third probe pins 103c extend in the assembled probe head 110.

In some embodiments, the adhesion layer 114 may also be formed over portions of the upper surface of the upper guide plate 111 and/or portions of the upper surface of the lower guide plate 112. In some embodiments, the adhesion layer 114 over the upper surface(s) of the upper guide plate 111 and/or the lower guide plate 112 may form continuous segments $114_1$ and $114_2$ extending between multiple openings 115 through the upper guide plate 111 and/or the lower guide plate 112. Gap regions 118 may separate the continuous segments $114_1$ and $114_2$.

In the embodiment shown in FIG. 1, a first continuous segment 1141 of the adhesion layer 114 may extend over the upper surface of the upper guide plate 111 between multiple openings 115 through which the first probe pins 103a extend. Similarly, a first continuous segment 1141 of the adhesion layer 114 may extend over the upper surface of the lower guide plate 112 between multiple openings 115 through which the first probe pins 103a extend. In some embodiments, the respective first continuous segments 1141 over the upper guide plate 111 and the lower guide plate 112 may extend between all of the openings 115 through which the first probe pins 103a extend.

Referring again to FIG. 1, a second continuous segment $114_2$ of the adhesion layer 114 may extend over the upper surface of the upper guide plate 111 between multiple openings 115 through which the second probe pins 103b and the third probe pins 103c extend, and a second continuous segment $114_2$ of the adhesion layer 114 may extend over the upper surface of the lower guide plate 112 between multiple openings 115 through which the second probe pins 103b and the third probe pins 103c extend. In some embodiments, the respective second continuous segments $114_2$ over the upper guide plate 111 and the lower guide plate 112 may extend between all of the openings 115 through which the second probe pins 103b and the third probe pins 103c extend.

Various alternative configurations for the adhesion layer 114 over the upper surface(s) of the upper guide plate 111 and/or the lower guide plate 112 are within the contemplated scope of disclosure. For example, the adhesion layer 114 may include at least three continuous segments, where a first continuous segment may extend between multiple openings 115 through which the first probe pins 103a extend, a second continuous segment may extend between multiple openings 115 through which the second probe pins 103b extend, and a third continuous segment may extend between multiple openings 115 through which the third probe pins 103c extend. Alternatively, the first continuous segment(s) may extend between multiple openings 115 through which the first probe pins 103a and the third probe pins 103c extend, and the second continuous segment(s) may extend between multiple openings 115 through which the second probe pins 103b extend.

The adhesion layer 114 may be deposited over the upper guide plate 111 and/or the lower guide plate 112 using a suitable deposition process, such as physical vapor deposition (PVD) (e.g., sputtering), electrochemical deposition (e.g., electroplating), and/or a printing process (e.g., a metal 3D printing process). Other suitable deposition processes are within the contemplated scope of disclosure. In some embodiments, the adhesion layer 114 may be deposited onto the upper guide plate 111 and/or the lower guide plate 112 in a desired pattern of continuous segment(s) and gap portion(s) 118. Alternatively, a continuous coating of conductive material may be deposited over the upper guide plate 111 and/or the lower guide plate 112 and select portions of the coating may be subsequently removed via a suitable technique (e.g., etching through a lithographically-patterned mask, a lift-off process, a laser ablation process, etc.) to provide the desired pattern of continuous segment(s) and gap portion(s) 118 of the adhesion layer 114.

Referring again to FIG. 1, a low dielectric constant material (i.e., a low-k material) layer 116 may be formed over the adhesion layer 114 in portions of the upper guide plate 111 and the lower guide plate 112. The low-k material layer 116 may be composed of a material having a lower dielectric constant than the material(s) of the upper guide plate 111 and the lower guide plate 112. For example, the upper guide plate 111 and the lower guide plate 112 may be composed of a ceramic material and may have a dielectric constant, k, that is greater than 8. The low-k material layer 116 may be composed of an insulating material having a dielectric constant, k, that is less than 8, such as 7 or less, including less than 3.6. Suitable materials for the low-k material layer 116 may include, without limitation, diamond-like carbon (DLC), and/or pure silica zeolite. Other suitable materials for the low-k material layer 116 are within the contemplated scope of disclosure.

Referring to FIG. 1, the low-k material layer 116 may be located within the openings 115 through the upper guide plate 111 and the lower guide plate 112 through which the third probe pins $103c_1$ and $103c_2$ extend in the assembled probe head 110. The low-k material layer 116 may also be formed over portions of the upper surfaces of the upper guide plate 111 and the lower guide plate 112 that surround the openings 115 through which the third probe pins $103c_1$ and $103c_2$ extend. In the embodiment shown in FIG. 1, the low-k material layer 116 may form a continuous segment that extends between the openings 115 through which the third probe pins $103c_1$ and $103c_2$ extend over the upper surfaces of both the upper guide plate 111 and the lower guide plate 112. As shown in FIG. 1, the side surfaces and collars 109 of each of the third probe pins $103c_1$ and $103c_2$ may contact and/or may be adjacent to the low-k material layer 116 in the assembled probe head. Accordingly, the low-k material layer 116 may be located between the third probe pins $103c_1$ and $103c_2$ as well as the upper guide plate 111 and the lower guide plate 112. Direct contact between the third probe pins $103c_1$ and $103c_2$ and the relatively high-k material(s) of the upper guide plate 111 and the lower guide plate 112 may be avoided. This may provide improved signal integrity (SI) of the loopback test signals that are transmitted through the third probe pins $103c_1$ and $103c_2$.

In various embodiments, the low-k material layer 116 may be formed over the adhesion layer 114 such that the adhesion layer 114 may be located between the low-k material layer 116 and the respective upper guide plate 111 and lower guide plate 112. The adhesion layer 114 may promote adhesion of the low-k material layer 116 to the upper guide plate 111 and the lower guide plate 112, and may also provide enhanced shielding between the third probe pins 103c and the high-k material(s) of the guide plates 111 and 112. In other embodiments, the low-k material 116 may be formed directly on the upper guide plate 111 and the lower guide plate 112.

In some embodiments, a low-k material layer 116 as described above may also be located between the upper guide plate 111 and/or the lower guide plate 112 and other probe pins of the probe card 117, in addition to, or in lieu of the third probe pins $103c_1$ and $103c_2$. For example, the low-k material layer 116 may be located between the first probe pin(s) 103a and/or the second probe pins 103b and the guide plate(s) 111 and 112, such as within the openings 115 through the guide plate(s) 111 and 112 through which the respective probe pins 103a, 103b extend.

The low-k material layer 116 may be deposited using a suitable deposition process, such as physical vapor deposition (PVD) (e.g., sputtering). Other suitable deposition processes are within the contemplated scope of disclosure. In some embodiments, the low-k material layer 116 may be deposited onto the upper guide plate 111 and/or the lower guide plate 112 in a desired pattern. Alternatively, a continuous coating of low-k material may be deposited over the upper guide plate 111 and/or the lower guide plate 112 and select portions of the coating may be subsequently removed via a suitable technique (e.g., etching through a lithographically-patterned mask, a lift-off process, a laser ablation process, etc.) to provide the desired pattern of the low-k material layer 116.

Referring again to FIG. 1, in various embodiments, the first continuous segment(s) $114_1$ of the adhesion layer 114 may electrically couple multiple first probe pins 103a, thereby electrically shorting multiple power connections to the DUT 101. In some embodiments, all of the first probe pins 103a in the probe head 110 may be electrically coupled by first continuous segment(s) $114_1$ of the adhesion layer 114. Alternatively, or in addition, the second continuous segment(s) $114_2$ of the adhesion layer 114 may electrically couple multiple second probe pins 103b, thereby electrically shorting multiple ground connections to the DUT 101. In some embodiments, all of the second probe pins 103b in the probe head 110 may be electrically coupled by second continuous segment(s) $114_2$ of the adhesion layer 114. The low-k material layer 116 surrounding each of the third probe pins $103c_1$ and $103c_2$ may prevent the third probe pins $103c_1$ and $103c_2$ from being electrically connected to (i.e., electrically shorted to) the second probe pins 103b via the second continuous segment(s) $114_2$ of the adhesion layer 114. Electrically shorting multiple first probe pins 103a and/or multiple second probe pins 103b within the probe head 110 may help to balance current spikes and may enable more effective thermal management in the circuit probe test system.

Figure 2:
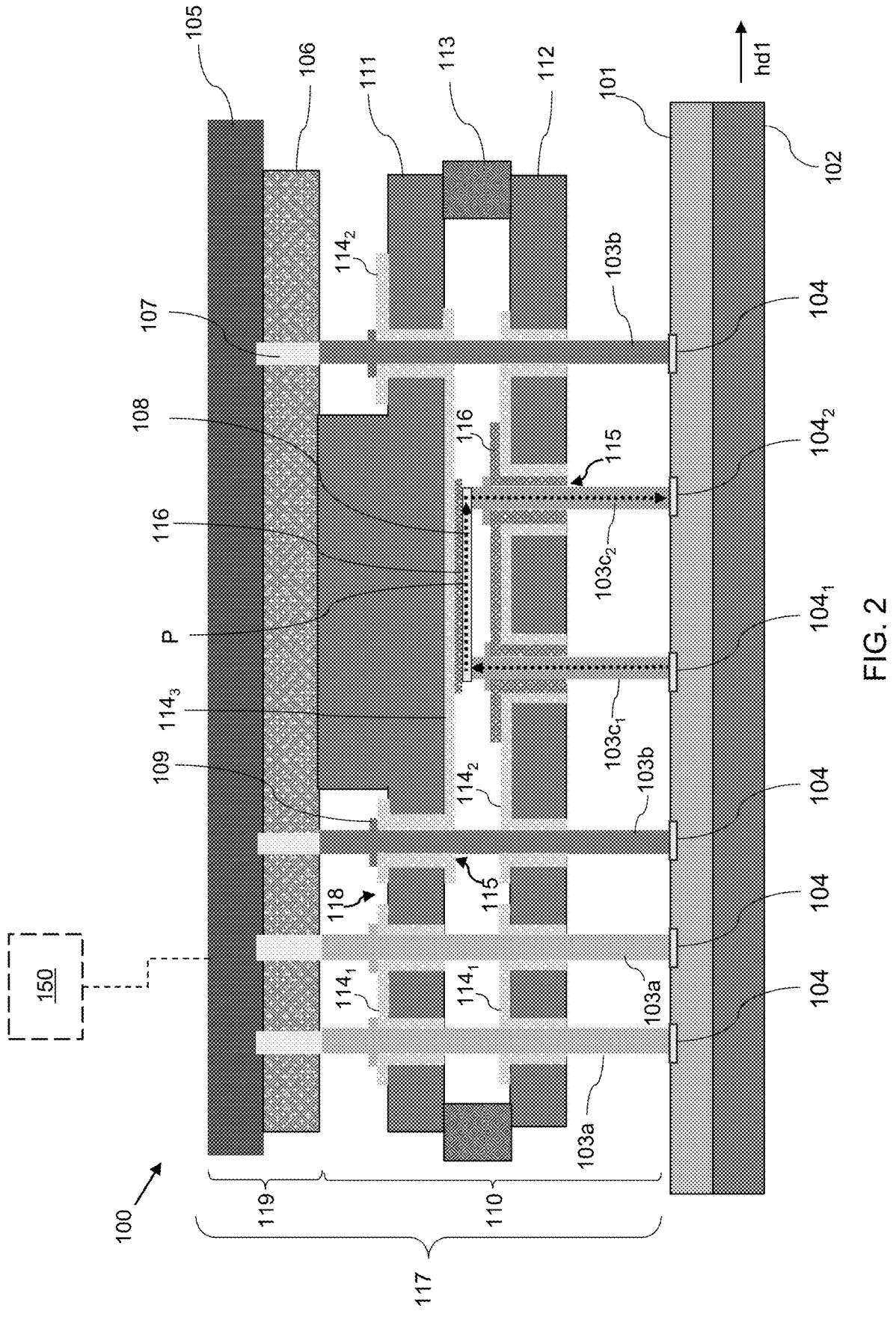
FIG. 2 is a vertical cross-section view of a portion of a circuit probe test system according to another embodiment of the present disclosure.

FIG. 2 is a vertical cross-section view of a portion of a circuit probe test system 100 according to another embodiment of the present disclosure. The circuit probe test system 100 shown in FIG. 2 may be similar to the circuit probe test system 100 described above with reference to FIG. 1. Thus, repeated discussion of like elements is omitted for brevity. The circuit probe test system 100 of FIG. 2 differs from the circuit probe test system 100 of FIG. 1 in that the length dimensions of the third probe pins $103c_1$ and $103c_2$ (i.e., the loopback probe pins $103c_1$ and $103c_2$) may be less than the length dimensions of the first probe pin(s) 103a and the second probe pin(s) 103b. In some embodiments, the length dimensions of the first probe pin(s) 103a and the second probe pin(s) 103b may be between 4 mm and 7 mm, and the length dimensions of the third probe pins $103c_1$ and $103c_2$ may be less than 4 mm, such as less than 2 mm, including 1 mm or less.

The circuit probe test system 100 shown in FIG. 2 may also differ from the circuit probe test system 100 of FIG. 1 in that the loopback signal path, P, may not be routed through the substrate portion 119 of the probe card 117, but may instead be routed through a conductive trace 108 located on and/or in the upper guide plate 111 and/or the lower guide plate 112 of the probe head 110. In the embodiment shown in FIG. 2, the loopback signal path, P, may extend from a first contact region 1041 on the DUT 101 through a third probe pin 103c1 along a conductive trace 108 located over the lower surface of the upper guide plate 111 that may electrically connect the third probe pin 103c1 to another third probe pin 103c2, and through the other third probe pin 103c2 to a second contact region 1042 on the DUT 101. Accordingly, the loopback signal path, P, as shown in FIG. 2 may be shorter than the loopback signal path in the embodiment shown in FIG. 1. The relatively shorter length of the loopback signal path, P, may contribute to improved signal integrity (SI) during circuit probe loopback tests.

In the embodiment shown in FIG. 2, the conductive trace 108 is shown on the lower surface of the upper guide plate 111. However, in other embodiments, the conductive trace 108 may be located in another portion of the probe head 110, such as on the upper surface of the upper guide plate 111, or on a surface of the lower guide plate 112. Further, although only a single conductive trace 108 is illustrated in FIG. 2, the probe head 110 may include a plurality of conductive traces 108 that may be electrically coupled to and extend between third probe pins 103c. Each conductive trace 108 may be used to electrically connect multiple contact regions 104 of the DUT 101 in series and/or in parallel, during a probe circuit loopback test.

As in the embodiment described above with reference to FIG. 1, an adhesion layer 114 may be formed within each of the openings 115 through the upper guide plate 111 and the lower guide plate 112. First and second continuous segments $114_1$ and $114_2$ of the adhesion layer 114 may be located over the upper surface of the upper guide plate 111 and over the upper surface of the lower guide plate 112. In addition, a third continuous segment $114_3$ may be located on the lower surface of the upper guide plate 111. In some embodiments, the continuous segments $114_1$, $114_2$ and $114_3$ of the adhesion layer 114 may electrically couple multiple first probe pins 103a and/or multiple second probe pins 103b.

A low-k material layer 116 as described above may be located within the openings 115 through the lower guide plate 112 through which the third probe pins 103c extend in the assembled probe head 110. The low-k material layer 116 may also be formed over portions of the upper surface the lower guide plate 112 surrounding the openings 115 through which the third probe pins 103c extend. The low-k material layer 116 may also be formed over the third continuous segment 1143 of the adhesion layer 114 on the lower surface of the upper guide plate 111. The adhesion layer 114 may promote adhesion of the low-k material layer 116 and may also provide enhanced shielding between the third probe pins 103c1 and 103c2 and the conductive trace 108 and the high-k material(s) of the upper and lower guide plates 111 and 112.

The conductive trace 108 may be formed over the low-k material layer 116 on the lower surface of the upper guide plate 111. The conductive trace may include a metallic material, such as copper, gold, nickel, tungsten, cobalt, molybdenum, ruthenium, etc., including alloys and combinations thereof. The conductive trace 108 may be formed using a suitable deposition technique as described above. In the embodiment shown in FIG. 2, the upper surfaces of the third probe pins $103c$ may contact the lower surface of the conductive trace 108.

Referring again to FIG. 2, the third probe pins $103c_1$ and $103c_2$ may extend through openings 115 in the lower guide plate 112, but may not extend through the upper guide plate 111. Accordingly, portions of the upper guide plate 111 located above the third probe pins $103c_1$ and $103c_2$ may be made thicker to provide increased mechanical strength.

Figure 3:
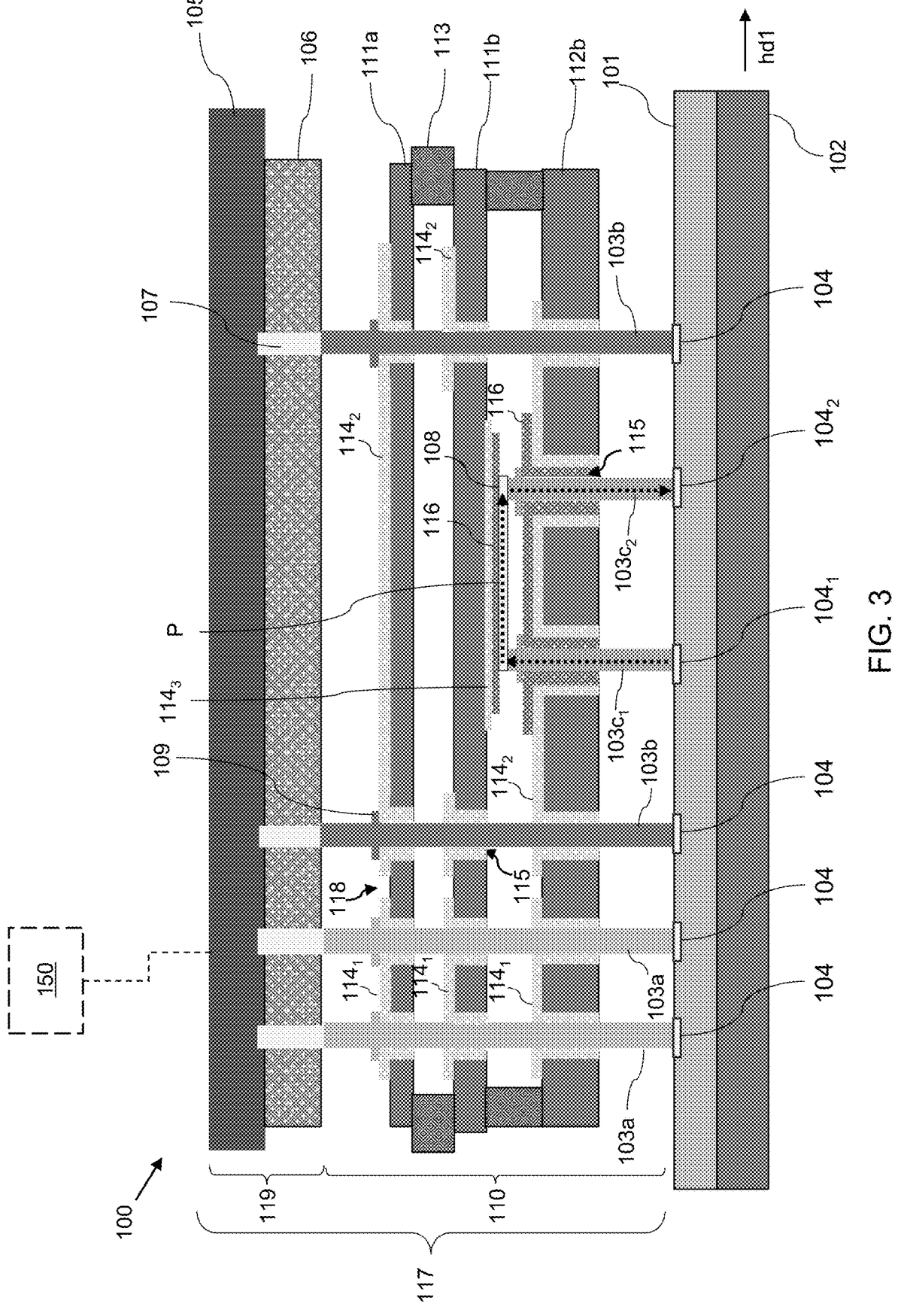
FIG. 3 is a vertical cross-section view of a portion of a circuit probe test system according to yet another embodiment of the present disclosure.

FIG. 3 is a vertical cross-section view of a portion of a circuit probe test system 100 according to yet another embodiment of the present disclosure. The circuit probe test system 100 shown in FIG. 3 may be similar to the circuit probe test system 100 described above with reference to FIG. 2. Thus, repeated discussion of like elements is omitted for brevity. The circuit probe test system 100 of FIG. 3 differs from the circuit probe test system 100 of FIG. 2 in that the upper guide plate 111 includes a two-piece construction including an upper portion $111a$ and a lower portion $111b$. In some embodiments, the circuit probe test system 100 of FIG. 3 may be considered to have a lower guide plate 112 with a two-piece construction including an upper portion $111b$ ($112a$) and a lower portion $112b$. Put another way, the lower portion $111b$ of the upper guide plate 111 may be referred to as an upper portion of the lower guide plate 112. For sake of simplicity, the middle portion will be referred herein as the lower portion $111b$ of the upper guide plate 111.

A spacer 113 may be located between the upper portion $111a$ and the lower portion $111b$ of the upper guide plate 111. Openings 115 may extend through the upper portion $111a$ and the lower portion $111b$ of the upper guide plate 111. First probe pins $103a$ and second probe pins $103b$ may extend through the openings 115 in the upper portion $111a$ and the lower portion $111b$ of the upper guide plate 111. An adhesion layer 114 may be located within each of the openings 115 in the upper portion $111a$ and the lower portion $111b$ of the upper guide plate 111.

In some embodiments, the adhesion layer 114 may be formed within the openings 115 through the upper portion $111a$ and the lower portion $111b$ of the upper guide plate 111 and within the openings 115 through the lower guide plate 112. First continuous segment $114_1$ and second continuous segment $114_2$ of the adhesion layer 114 may be located over the upper surfaces of the upper portion $111a$ and the lower portion $111b$ of the upper guide plate 111, and over the upper surface of the lower guide plate 112. In addition, a third continuous segment $114_3$ may be located on the lower surface of the lower portion $111b$ of the upper guide plate 111. In some embodiments, the continuous segments $114_1$, $114_2$ and $114_3$ of the adhesion layer 114 may electrically couple multiple first probe pins $103a$ and/or multiple second probe pins $103b$.

A low-k material layer 116 may be located within the openings 115 through the lower guide plate 112 through which the third probe pins $103c_1$ and $103c_2$ extend in the assembled probe head 110. The low-k material layer 116 may also be formed over portions of the upper surface the lower guide plate 112 surrounding the openings 115 through which the third probe pins $103c_1$ and $103c_2$ extend. The low-k material layer 116 may also be formed over the third continuous segment $114_3$ of the adhesion layer 114 on the lower surface of the lower portion $111b$ of the upper guide plate 111.

The loopback signal path, P, in the embodiment of FIG. 3 may be similar to the loopback signal path, P, described above with reference to FIG. 2. That is, the loopback signal path, P, may extend from a first contact region 1041 on the DUT 101 through a third probe pin $103c1$ along a conductive trace 108 located over the lower surface of lower portion $111b$ of the upper guide plate 111, and through another third probe pin $103c2$ to a second contact region 1042 on the DUT 101. Accordingly, the third loopback pins $103c$ may not extend through either the upper portion $111a$ or the lower portion $111b$ of the upper guide plate 111.

Figure 4A:
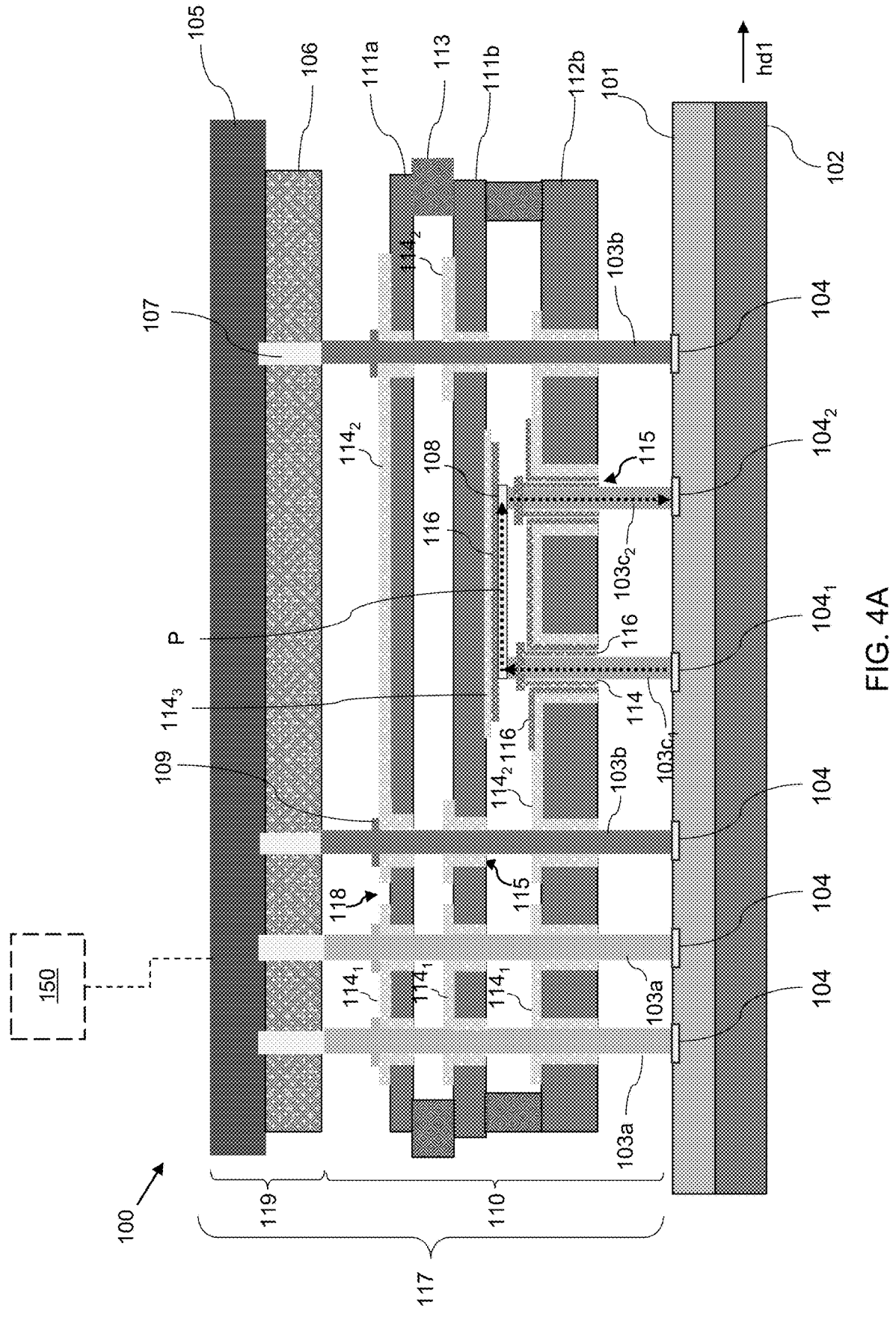
FIG. 4A is a vertical cross-section view of a portion of a circuit probe test system according to yet another embodiment of the present disclosure.

FIG. 4A is a vertical cross-section view of a portion of a circuit probe test system 100 according to yet another embodiment of the present disclosure. The circuit probe test system 100 shown in FIG. 4A may be similar to the circuit probe test system 100 described above with reference to FIG. 3. Thus, repeated discussion of like elements is omitted for brevity. The circuit probe test system 100 of FIG. 4A differs from the circuit probe test system 100 of FIG. 3 in that an adhesion layer 114 and a low-k material layer 116 may be provided on the third probe pins $103c1$ and $103c2$. The adhesion layer 114 and the low-k material layer 116 on the third probe pins $103c1$ and $103c2$ may be composed of identical or similar materials as the adhesion layer 114 and the low-k material layer 116 formed on the upper guide plate 111 and the lower guide plate 112 of the probe head 110. The adhesion layer 114 and the low-k material layer 116 on the third probe pins $103c1$ and $103c2$ may be in addition to, or may be in lieu of, the adhesion layer 114 and the low-k material layer 116 formed on the upper guide plate 111 and the lower guide plate 112.

Referring to FIG. 4A, the adhesion layer 114 and the low-k material layer 116 may be formed on portions of the third probe pins $103c_1$ and $103c_2$ that are located adjacent to the relatively high-k materials of the lower guide plate 112 and/or the upper guide plate 111 in the assembled probe head 110. Accordingly, the adhesion layer 114 and the low-k material layer 116 may be located between the electrically conductive material of the third probe pins $103c_1$ and $103c_2$ and the high-k material(s) of the lower guide plate 112 and/or the upper guide plate 111.

In other embodiments, an adhesion layer 114 and the low-k material layer 116 may be formed on portions of additional probe pins of the circuit probe test system 100, such as the first probe pins $103a$ and/or the second probe pins $103b$.

Figure 4D:
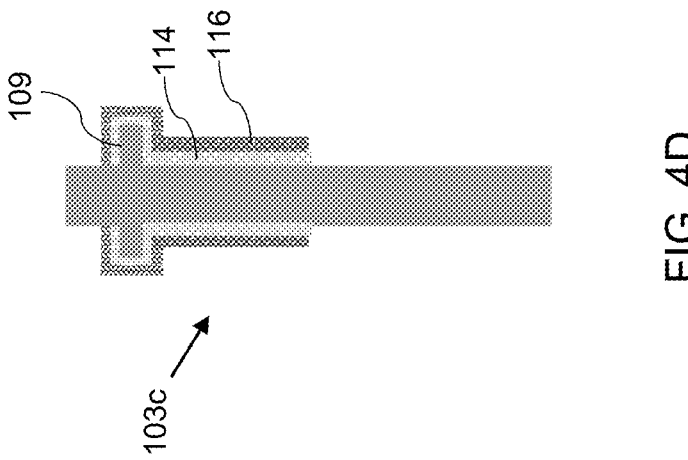
FIG. 4D is a vertical cross-section view of a probe pin including an adhesion layer formed over a portion of the probe pin and a low-k material layer formed over the adhesion layer according to various embodiments of the present disclosure
Figure 4C:
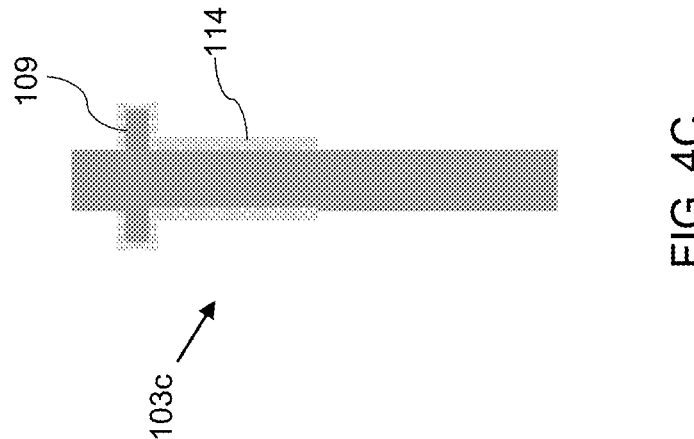
FIG. 4C is a vertical cross-section view of a probe pin including an adhesion layer formed over a portion of the probe pin according to various embodiments of the present disclosure.
Figure 4B:
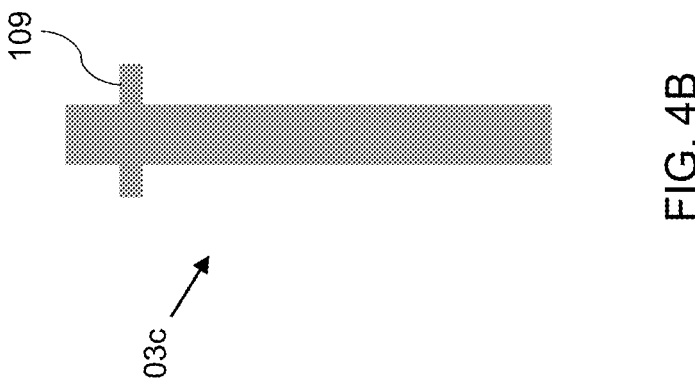
FIG. 4B is a vertical cross-section view of a probe pin according to various embodiments of the present disclosure.

FIGS. 4B-4D are sequential vertical cross-section views of a third probe pin $103c$ (i.e., third probe pin $103c1$ or $103c2$ in FIG. 4A) illustrating a process of forming an adhesion layer 114 and a low-k material layer 116 over a portion of the third probe pin $103c$. Referring to FIG. 4B, the third probe pin $103c$ may include an elongated structure including an electrically conductive material. The third probe pin $103c$ may also include a collar portion 109 including an electrically conductive material that may be used to secure the third probe pin $103c$ within an opening 115 through upper guide plate 111 and lower guide plate 112 of the probe head 110. Referring to FIG. 4C, an adhesion layer 114 may be formed over a portion of the third probe pin $103c$ via a suitable deposition process as described above. Referring to FIG. 4D, a low-k material layer 116 may be formed over the adhesion layer 114 using a suitable deposition process as described above. The adhesion layer 114 and the low-k material layer 116 may be formed over one or more regions of the third probe pin $103c$ that may be adjacent to, or may contact, the relatively high-k material of the lower guide plate 112 and/or the upper guide plate 111. In some embodiments, the adhesion layer 114 may be omitted, and the low-k material layer 116 may be formed directly on one or more portions of the third probe pin $103c$.

However, providing the adhesion layer 114 between the probe pins 103c and the low-k material layer 116 may promote adhesion of the low-k material layer 116 to the third probe pins 103c, and may also provide enhanced shielding between the third probe pin 103c and the high-k material of the lower guide plate 112 and/or the upper guide plate 111.

It will be understood that a third probe pin 103c including a low-k material layer 116 over one or more portions of the third probe pin 103c may also be utilized in a circuit probe test system 100 as shown in FIG. 1 or 2. In the case of a circuit probe test system 100 as shown in FIG. 1, the third probe pins 103c may include a low-k material layer 116, and optionally an adhesion layer 114, over the third probe pins 103c adjacent to the upper guide plate 111 and the lower guide plate 112 when the third probe pins 103c are assembled in the probe head 110.

Figure 5:
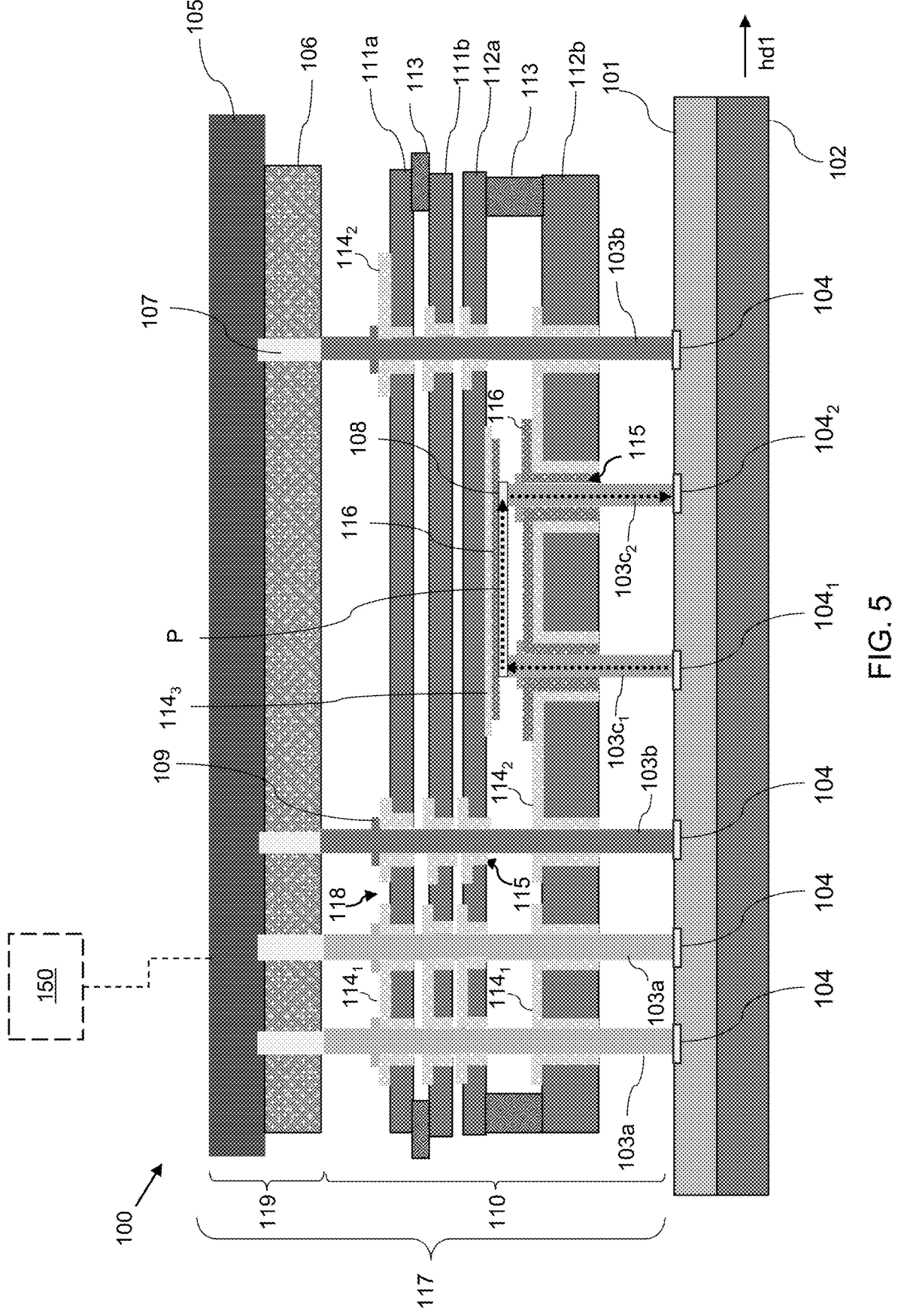
FIG. 5 is a vertical cross-section view of a portion of a circuit probe test system according to yet another embodiment of the present disclosure.

FIG. 5 is a vertical cross-section view of a portion of a circuit probe test system 100 according to yet another embodiment of the present disclosure. The circuit probe test system 100 shown in FIG. 5 may be similar to the circuit probe test system 100 described above with reference to FIG. 3. Thus, repeated discussion of like elements is omitted for brevity. The circuit probe test system 100 of FIG. 5 differs from the circuit probe test system 100 of FIG. 3 in that the lower guide plate 112 also includes a two-piece construction including an upper portion 112a and a lower portion 112b. A spacer 113 may be located between the upper portion 112a and the lower portion 112b of the lower guide plate 112. Openings 115 may extend through the upper portion 112a and the lower portion 112b of the lower guide plate 112. First probe pins 103a and second probe pins 103b may extend through the openings 115 in the upper portion 112a and the lower portion 112b of the lower guide plate 112. An adhesion layer 114 may be located within each of the openings 115 in the upper portion 112a and the lower portion 112b of the lower guide plate 112.

In some embodiments, the adhesion layer 114 may be formed within the openings 115 through the upper portion 111a and the lower portion 111b of the upper guide plate 111 and within the openings 115 through the upper portion 112a and the lower portion 112b of the lower guide plate 112. First continuous segments 1141 and second continuous segments 1142 of the adhesion layer 114 may be located over the upper surfaces of the upper portion 111a and the lower portion 111b of the upper guide plate 111, and over the upper surfaces of the upper portion 112a and the lower portion 112b of the lower guide plate 112. In addition, a third continuous segment 1143 may be located on the lower surface of the upper portion 112a of the lower guide plate 112. In some embodiments, the first continuous segments 1141, second continuous segments 1142 and/or third continuous segment 1143 of the adhesion layer 114 may electrically couple multiple first probe pins 103a and/or multiple second probe pins 103b.

A low-k material layer 116 may be located within the openings 115 through the lower portion 112b of the lower guide plate 112 through which the third probe pins 103$c_1$ and 103$c_2$ extend in the assembled probe head 110. The low-k material layer 116 may also be formed over portions of the upper surface the lower portion 112b of the lower guide plate 112 surrounding the openings 115 through which the third probe pins 103$c_1$ and 103$c_2$ extend. The low-k material layer 116 may also be formed over the third continuous segment 114$_3$ of the adhesion layer 114 on the lower surface of the upper portion 112a of the lower guide plate 112.

The loopback signal path, P, may extend from a first contact region 1041 on the DUT 101 through a third probe pin 103$c1$ along a conductive trace 108 located over the lower surface of the upper portion 112b of the lower guide plate 112, and through another third probe pin 103$c2$ to a second contact region 1042 on the DUT 101. Accordingly, the third probe pins 103$c1$ and 103$c2$ may extend through the lower portion 112b of the lower guide plate 112, but may not extend through the upper portion 112a of the lower guide plate 112, the lower portion 111b of the upper guide plate 111, or the upper portion 111a of the upper guide plate 111.

FIG. 6 is a flow chart showing a method 200 of fabricating a probe card 117 for a circuit probe test system 100 according to various embodiments of the present disclosure. Referring to FIGS. 1-4A, 5 and 6, in step 201 of method 200, a low-k material layer 116 may be formed within openings 115 through a guide plate 111, 112, where a dielectric constant of the low-k material layer 116 is less than a dielectric constant of the guide plate 111, 112. Referring to FIGS. 1-4A, 5 and 6, in step 203 of method 200, the guide plate 111, 112 may be assembled into a probe card 117 including a substrate portion 119, the guide plate 111, 112 disposed below the substrate portion 119, and a plurality of probe pins 103$c1$ and 103$c2$ extending through openings 115 in the guide plate 111, 112, where the low-k material layer 116 is located between the probe pins 103$c1$ and 103$c2$ and the guide plate 111, 112.

FIG. 7 is a flow chart showing a method 210 of fabricating a probe pin 103a, 103b, 103$c_1$ and 103$c_2$ for a use in a circuit probe test system 100 according to various embodiments of the present disclosure. Referring to FIGS. 4B-4D and 7, in step 211 of method 210, an optional adhesion layer 114 may be formed over a portion of the probe pin 103a, 103b, 103$c_1$ and 103$c_2$ using a suitable deposition process, such as physical vapor deposition (PVD) (e.g., sputtering), electrochemical deposition (e.g., electroplating), and/or a printing process (e.g., a metal 3D printing process). Other suitable deposition processes are within the contemplated scope of disclosure. The adhesion layer 114 may be formed over a portion of the probe pin 103a, 103b, 103$c_1$ and 103$c_2$ and collar 109 as illustrated in FIG. 4C.

Referring to FIGS. 4D and 7, in step 212, the low-k material layer 116 may be formed on portions of the probe pin 103a, 103b, 103$c_1$ and 103$c_2$, which may include the collar 109, that are located adjacent to the relatively high-k materials of the lower guide plate 112 and/or the upper guide plate 111 in the assembled probe head 110. Accordingly, the optional adhesion layer 114 and the low-k material layer 116 may be located between the electrically conductive material of the probe pin 103a, 103b, 103$c_1$ and 103$c_2$ and the high-k material(s) of the lower guide plate 112 and/or the upper guide plate 111. The low-k material layer 116 may be formed on portions of the probe pin 103a, 103b, 103$c_1$ and 103$c_2$ using a suitable deposition process, such as physical vapor deposition (PVD) (e.g., sputtering). Other suitable deposition processes are within the contemplated scope of disclosure.

Referring to FIGS. 4B-4D and 7, in step 213 of method 210, the guide plate 111, 112 may be assembled into a probe card 117 including a substrate portion 119, the guide plate 111, 112 disposed below the substrate portion 119, and a plurality of probe pins 103a, 103b, 103$c_1$ and 103$c_2$ extending through openings 115 in the guide plate 111, 112, where the low-k material layer 116 is located between the probe pins 103a, 103b, 103$c_1$ and 103$c_2$ and the guide plate 111, 112.

The adhesion layer 114 and the low-k material layer 116 may be formed over one or more regions of the third probe pin 103$c1$ and 103$c2$ that may be adjacent to, or may contact, the relatively high-k material of the lower guide plate 112 and/or the upper guide plate 111. In some embodiments, the adhesion layer 114 may be omitted, and the low-k material layer 116 may be formed directly on one or more portions of the third probe pin 103c1 and 103c2. However, providing the adhesion layer 114 between the probe pins 103a, 103b, 103c1 and 103c2 and the low-k material layer 116 may promote adhesion of the low-k material layer 116 to the probe pins 103a, 103b, 103c1 and 103c2, and may also provide enhanced shielding between the probe pin 103a, 103b, 103c and the high-k material of the lower guide plate 112 and/or the upper guide plate 111.

Referring to all drawings and according to various embodiments of the present disclosure, a probe card 117 for a circuit probe test system 100 includes a substrate portion 119, an upper guide plate 111, a lower guide plate 112 located below the substrate portion 119, the guide plate 111, 112 including a plurality of openings 115 through the guide plate 111, 112, and a plurality of probe pins 103a, 103b, $103c_1$ and $103c_2$ extending through the openings 115 through the guide plate 111, 112, the plurality of probe pins 103a, 103b, $103c_1$ and $103c_2$ including at least one first probe pin 103a configured to carry power between the substrate portion 119 and a device-under-test (DUT) 101, at least one second probe pin 103b configured to electrically couple the DUT 101 to ground, and at least two third probe pins $103c_1$ and $103c_2$ configured to carry loopback test signals between contact regions 104 on the DUT 101, where a low-k material layer 116 having a dielectric constant that is less than the dielectric constant of the guide plate 111, 112 is located between the at least two third probe pins 103c and the guide plate 111, 112.

In an embodiment, the guide plate 111, 112 includes a ceramic material having a dielectric constant that is greater than 8.

In another embodiment, the low-k material layer 116 includes at least one of diamond-like carbon and pure silica zeolite.

In another embodiment, the low-k material layer 116 is located within each of the openings 115 through the guide plate 111, 112 through which each of the at least two third probe pins $103c_1$ and $103c_2$ extend, and the low-k material layer 116 is not present within the openings 115 through the guide plate 111, 112 through which each first probe pin 103a and each second probe pin 103b extend.

In another embodiment, the low-k material layer 116 is located over an upper surface of the guide plate 111, 112 surrounding the openings 115 through the guide plate 111, 112 through which the third probe pins $103c_1$ and $103c_2$ extend, and each of the at least two third probe pins $103c_1$ and $103c_2$ includes a feature 109 that projects radially outward from the probe pin $103c_1$ and $103c_2$ and contacts the low-k material layer 116 located over the upper surface of the guide plate 111, 112.

In another embodiment, the guide plate is a lower guide plate 112, and the probe head 110 further includes an upper guide plate 111 a plurality of openings 115 through the upper guide plate 111 located between the substrate portion 119 and the lower guide plate 112, where the low-k material layer 116 is located between the at least two third probe pins $103c_1$ and $103c_2$ and the upper guide plate 111.

In another embodiment, the at least two third probe pins 103c1 and 103c2 extend through the openings 115 in the upper guide plate 111 and contact the substrate portion 119, and a conductive trace 108 located on or in the probe card 117 electrically couples the at least two third probe pins 103c1 and 103c2 to provide a loopback signal path P.

In another embodiment, the probe card 117 includes a conductive trace 108 over a surface of a guide plate 111, 112 that electrically couples the at least two third probe pins $103c_1$ and $103c_2$ to provide a loopback signal path P, wherein the low-k material layer 116 is located between the conductive trace 108 and the surface of the guide plate 111, 112.

In another embodiment, the probe card 117 further includes an adhesion layer 114 including an electrically conductive material located between the low-k material layer 116 and the surface of the guide plate 111, 112.

In another embodiment, the conductive trace 108 is located over a lower surface of the upper guide plate 111.

In another embodiment, the lower guide plate 112 includes an upper portion 112a and a lower portion 112b, where the conductive trace 108 is located over a lower surface of the upper portion 112a of the lower guide plate 112, and the at least two third probe pins $103c_1$ and $103c_2$ extend through openings 115 in the lower portion 112b of the lower guide plate 112.

In another embodiment, the probe card 117 further includes an adhesion layer 114 including an electrically conductive material located within each of the openings 115 through the guide plate 111, 112 through which each of the at least two third probe pins $103c_1$ and $103c_2$ extend.

In another embodiment, the adhesion layer 114 is located within the openings 115 through the guide plate 111, 112 through which each first probe pin 103a and each second probe pin 103b extend.

In another embodiment, a continuous segment $114_2$ of the adhesion layer 114 is located over a surface of the guide plate 111, 112 and electrically couples at least two second probe pins 103b.

In another embodiment, the low-k material layer 116 is located between the guide plate 111, 112 and the at least one first probe pin 103a.

In another embodiment, the low-k material layer 116 is located over a portion of each of the at least two third probe pins $103c_1$ and $103c_2$ that is adjacent to the guide plate 111, 112.

Another embodiment is drawn to a probe head 110 for a circuit probe test system 100 that includes a guide plate 111, 112 including a plurality of openings 115 through the guide plate 111, 112, a low-k material layer 116 having a dielectric constant that is less than a dielectric constant of the guide plate 111, 112 over a surface of the guide plate 111, 112 and extending between a pair of the openings 115, a conductive trace 108 over the low-k material layer 116, and a plurality of probe pins 103a, 103b, 103c1 and 103c2 extending through the openings 115 through the guide plate 111, 112, wherein a pair of probe pins 103c1 and 103c2 are electrically connected by the conductive trace 108 to form a loopback signal path P.

In an embodiment, the probe head 110 further includes an adhesion layer 114 including an electrically conductive material over the surface of the guide plate 111, 112 between the low-k material layer 116 and the surface of the guide plate 111, 112, where the adhesion layer 114 electrically couples at least two of the probe pins 103a, 103b extending through the openings 115 in the guide plate 111, 112.

Another embodiment is drawn to a method of fabricating a probe card 117 for a circuit probe test system 100 that includes forming a low-k material layer 116 within openings 115 through a guide plate 111, 112, where a dielectric constant of the low-k material layer 116 is less than a dielectric constant of the guide plate 111, 112, and assembling the guide plate 111, 112 into a probe card 117 including a substrate portion 119, the guide plate 111, 112 disposed below the substrate portion 119, and a plurality of probe pins 103c₁ and 103c₂ extending through openings 115 in the guide plate 111, 112, where the low-k material layer 116 is located between the probe pins 103c₁ and 103c₂ and the guide plate 111, 112.

In an embodiment, the method further includes forming an adhesion layer 114 including an electrically conductive material within the openings 115 through the guide plate 111, 112, where the low-k material layer 116 is formed over the adhesion layer 114.

Another embodiment is drawn to a method of making a probe pin 103a, 103b, 103c₁ and 103c₂ for a circuit probe test system 100 that includes forming a low-k material layer 116 over portions of the probe pin 103a, 103b, 103c₁ and 103c₂, where a dielectric constant of the low-k material layer 116 is less than a dielectric constant of the guide plate 111, 112, and assembling the guide plate 111, 112 into a probe card 117 including a substrate portion 119, the guide plate 111, 112 disposed below the substrate portion 119, and a plurality of probe pins 103a, 103b, 103c₁ and 103c₂ extending through openings 115 in the guide plate 111, 112, where the low-k material layer 116 is located between each of the plurality of probe pins 103a, 103b, 103c₁ and 103c₂ and the guide plate 111, 112.

In an embodiment, the method further includes forming an adhesion layer 114 including an electrically conductive material over portions of the probe pin 103a, 103b, 103c₁ and 103c₂ through the guide plate 111, 112, where the low-k material layer 116 is formed over the adhesion layer 114 such that the adhesion layer 114 and the low-k material layer 116 may be formed over one or more regions of the probe pin 103a, 103b, 103c₁ and 103c₂ that may be adjacent to, or may contact, the relatively high-k material of the lower guide plate 112 and/or the upper guide plate 111 once the guide plate 111, 112 are assembled into a probe card 117 including a substrate portion 119, the guide plate 111, 112 disposed below the substrate portion 119, and a plurality of probe pins 103a, 103b, 103c₁ and 103c₂ extending through openings 115 in the guide plate 111, 112.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe card for a circuit probe test system, comprising:
a substrate portion;
a guide plate located below the substrate portion, the guide plate comprising a plurality of openings through the guide plate;
a plurality of probe pins extending through the openings through the guide plate, the plurality of probe pins comprising at least one first probe pin configured to carry power between the substrate portion and a device-under-test (DUT), at least one second probe pin configured to electrically couple the DUT to ground, and at least two third probe pins configured to carry loopback test signals between contact regions on the DUT; and an adhesion layer comprising an electrically conductive material located within each of the openings through the guide plate through which each of the at least two third probe pins extend,
wherein a low-k material layer having a dielectric constant that is less than the dielectric constant of the guide plate is located between the at least two third probe pins and the guide plate.

2. The probe card of claim 1, wherein the guide plate comprises a ceramic material having a dielectric constant that is greater than 8.

3. The probe card of claim 2, wherein the low-k material layer comprises at least one of diamond-like carbon and pure silica zeolite.

4. The probe card of claim 1, wherein the low-k material layer is located within each of the openings through the guide plate through which each third probe pin extends, and the low-k material layer is not present within the openings through the guide plate through which each first probe pin and each second probe pin extend.

5. The probe card of claim 1, wherein the low-k material layer is located over an upper surface of the guide plate surrounding the openings through the guide plate through which the at least two third probe pins extend, and each of the at least two third probe pins comprises a feature that projects radially outward from the at least two third probe pins and contacts the low-k material layer located over the upper surface of the guide plate.

6. The probe card of claim 1, wherein the guide plate comprises a lower guide plate, and an upper guide plate comprising a plurality of openings through the upper guide plate located between the substrate portion and the lower guide plate, wherein the low-k material layer is located between the at least two third probe pins and the upper guide plate.

7. The probe card of claim 6, wherein the at least two third probe pins extend through the openings in the upper guide plate and contact the substrate portion, and a conductive trace located on or in the probe card electrically couples the at least two third probe pins to provide a loopback signal path.

8. The probe card of claim 6, further comprising a conductive trace over a surface of the upper guide plate or the lower guide plate that electrically couples the at least two third probe pins to provide a loopback signal path, wherein the low-k material layer is located between the conductive trace and the surface of the guide plate.

9. The probe card of claim 8, further comprising the adhesion layer comprising electrically conductive material is further located between the low-k material layer and the surface of the guide plate.

10. The probe card of claim 8, wherein the conductive trace is located over a lower surface of the upper guide plate.

11. The probe card of claim 8, wherein the lower guide plate comprises an upper portion and a lower portion, wherein the conductive trace is located over a lower surface of the upper portion of the lower guide plate, and the at least two third probe pins extend through openings in the lower portion of the lower guide plate.

12. The probe card of claim 1, wherein the adhesion layer is further located within the openings through the guide plate through which each first probe pin and each second probe pin extend.

13. The probe card of claim 12, wherein a continuous segment of the adhesion layer is located over a surface of the guide plate and electrically couples at least two second probe pins.

14. The probe card of claim 1, wherein the low-k material layer is located between the guide plate and the at least one first probe pin.

15. The probe card of claim 1, wherein the low-k material layer is located over a portion of each of the at least two third probe pins that is adjacent to the guide plate.

16. A probe head for a circuit probe test system, comprising:

a guide plate comprising a plurality of openings through the guide plate;

a low-k material layer having a dielectric constant that is less than a dielectric constant of the guide plate over a surface of the guide plate and extending between a pair of the openings;

a conductive trace over the low-k material layer;

a plurality of probe pins extending through the openings through the guide plate, wherein a pair of probe pins are electrically connected by the conductive trace to form a loopback signal path; and an adhesion layer comprising an electrically conductive material over the surface of the guide plate between the low-k material layer and the surface of the guide plate, wherein the adhesion layer electrically couples at least two of the plurality of probe pins extending through the openings in the guide plate.

17. The probe head of claim 16, wherein the adhesion layer comprises a metal selected from the group consisting of copper, gold, silver, aluminum, titanium, chromium, alloys thereof, and combinations thereof.

18. The probe card of claim 1, wherein each of the plurality of probe pins have a length of between 4 mm and 7 mm.

19. A probe card for a circuit probe test system, comprising:

a substrate portion;

an upper guide plate and a lower guide plate located below the substrate portion, each of the upper guide plate and the lower guide plate comprising a plurality of openings;

a plurality of probe pins extending through the plurality of openings in the lower guide plate, the plurality of probe pins comprising at least one first probe pin configured to carry power between the substrate portion and a device-under-test (DUT), at least one second probe pin configured to electrically couple the DUT to ground, and at least two third probe pins configured to carry loopback test signals between contact regions on the DUT, wherein the at least two third probe pins extend through the plurality of openings in the lower guide plate but not through the plurality of openings in the upper guide plate;

a conductive trace on a lower surface of the upper guide plate electrically coupling the at least two third probe pins to provide a loopback signal path; and a low-k material layer having a dielectric constant less than a dielectric constant of the lower guide plate, the low-k material layer located within the openings in the lower guide plate through which the at least two third probe pins extend.

20. The probe card of claim 19, further comprising an adhesion layer comprising an electrically conductive material located between the low-k material layer and the lower surface of the upper guide plate, wherein the conductive trace is formed over the low-k material layer.

* * * * *